United States Patent
Zeng

(10) Patent No.: US 12,464,708 B2
(45) Date of Patent: Nov. 4, 2025

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventor: Yizhi Zeng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 433 days.

(21) Appl. No.: 18/153,355

(22) Filed: Jan. 12, 2023

(65) Prior Publication Data
US 2024/0064969 A1 Feb. 22, 2024

(30) Foreign Application Priority Data
Aug. 22, 2022 (CN) .......................... 202211009652.2

(51) Int. Cl.
H10B 12/00 (2023.01)
(52) U.S. Cl.
CPC ........... H10B 12/485 (2023.02); H10B 12/02 (2023.02); H10B 12/482 (2023.02)
(58) Field of Classification Search
CPC ..... H10B 12/485; H10B 12/02; H10B 12/482
See application file for complete search history.

(56) References Cited

U.S. PATENT DOCUMENTS

| | | | | |
|---|---|---|---|---|
| 10,756,093 | B1* | 8/2020 | Pandey | H10B 12/488 |
| 2021/0082924 | A1* | 3/2021 | Seong | H10B 12/315 |
| 2022/0093607 | A1* | 3/2022 | Ping | H10B 12/482 |

FOREIGN PATENT DOCUMENTS

| | | |
|---|---|---|
| CN | 108470710 B | 9/2019 |
| CN | 114242659 A | 3/2022 |

* cited by examiner

*Primary Examiner* — Yasser A Abdelaziez
(74) *Attorney, Agent, or Firm* — Kilpatrick Townsend & Stockton LLP

(57) ABSTRACT

Embodiments provide a semiconductor structure and fabricating method. The method includes: providing a substrate having active structures, where each active structure has a bit line contact region; forming conductive support strips spaced along a first direction, where each conductive support strip extends along a second direction, each conductive support strip connects the bit line contact regions, the bit line contact regions are arranged along the second direction, and the first direction intersects the second direction; forming an initial isolation structure covering a side surface and a top surface of each conductive support strip; removing the initial isolation structure positioned on the top surface of each conductive support strip; removing the conductive support strip by at least a portion of thickness to form a first filling region; where a retained portion of the initial isolation structure forms an isolation structure; and forming a bit line structure in the first filling region.

14 Claims, 17 Drawing Sheets

SEMICONDUCTOR STRUCTURE AND METHOD FOR FABRICATING SAME

CROSS-REFERENCE TO RELATED APPLICATION

This application claims priority to Chinese Patent Application No. 202211009652.2, titled "SEMICONDUCTOR STRUCTURE AND METHOD FOR FABRICATING SAME" and filed to the State Patent Intellectual Property Office on Aug. 22, 2022, the entire contents of which are incorporated herein by reference.

TECHNICAL FIELD

Embodiments of the present disclosure relate to the field of semiconductor technology, and more particularly, to a semiconductor structure and a method for fabricating the same.

BACKGROUND

As a semiconductor memory that randomly writes and reads data at a high speed, a dynamic random access memory (DRAM) is widely used in data storage devices or apparatuses. The DRAM generally includes a plurality of memory cells, each of which generally includes a transistor and a capacitor. The capacitor stores data information, and the transistor controls read/write of the data information in the capacitor. A gate of the transistor is electrically connected to a word line (WL) of the DRAM, such that turn-on/turn-off of the transistor is controlled via a voltage of the WL. One of a source and a drain of the transistor is electrically connected to a bit line (BL), and other one of the source and the drain is electrically connected to the capacitor, such that the data information is stored or outputted via the bit line.

However, during fabrication of the BL, the BL is prone to tilting or necking.

SUMMARY

In view of the above problem, embodiments of the present disclosure provide a semiconductor structure and a method for fabricating the same.

A first aspect of the embodiments of the present disclosure provides a method for fabricating a semiconductor structure, which includes: providing a substrate having a plurality of active structures, where each of the plurality of active structures has a bit line contact region; forming a plurality of conductive support strips spaced along a first direction, where each of the plurality of conductive support strips extends along a second direction, each of the plurality of conductive support strips is connected to the plurality of bit line contact regions, the plurality of bit line contact regions are arranged along the second direction, and the first direction and the second direction intersect with each other; forming an initial isolation structure covering a side surface and a top surface of each of the plurality of conductive support strips; removing the initial isolation structure positioned on the top surface of a given one of the plurality of conductive support strips; removing the given conductive support strip by at least a portion of thickness to form a first filling region; where a retained portion of the initial isolation structure forms an isolation structure; and forming a bit line structure in the first filling region.

A second aspect of the embodiments of the present disclosure provides a semiconductor structure, which is fabricated by means of the method for fabricating the semiconductor structure according to the first aspect. The semiconductor structure includes: a substrate having a plurality of active structures, where each of the plurality of active structures has a bit line contact region; a plurality of bit line structures spaced along a first direction, where each of the plurality of bit line structures extends along a second direction, and each of the plurality of bit line structures is connected to the bit line contact regions positioned in a same column in the second direction; and an isolation structure covering a side surface of each one of the plurality of bit line structures.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

Figure 1:
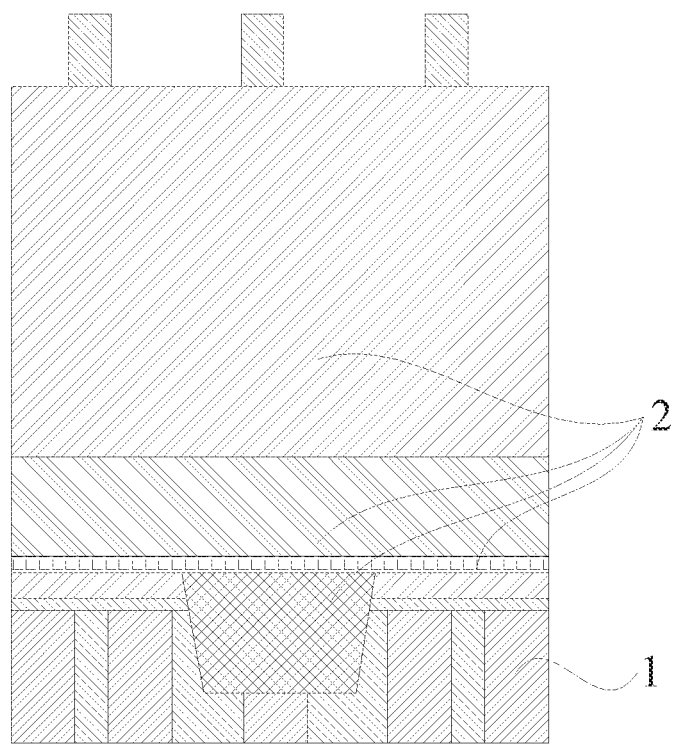
FIG. 1 is a schematic diagram of a stack provided by the related technologies.

Reference numerals in the accompanying drawings:
1: substrate; 2: stack layer; 3: bit line structure;
100: substrate; 110: active structure; 120: shallow trench isolation structure; 111: bit line contact region; 112: capacitor contact region;
200: conductive support strip; 210: conductive support layer; 220: trench;
300: mask layer; 310: mask pattern;
400: initial isolation structure; 410: initial isolation spacer; 411: first initial isolation layer; 412: second initial isolation layer; 413: third initial isolation layer; 420: initial dielectric layer; 430: groove;
500: isolation structure; 510: isolation spacer; 511: first isolation layer; 512: second isolation layer; 513: third isolation layer; 520: dielectric layer;
600: bit line structure; 610: first filling region; 620: second filling region; 630: bit line contact; 640: bit line; 641: bit line barrier layer; 642: bit line conductive layer; and 643: bit line insulating layer.

DETAILED DESCRIPTION

Figure 2:
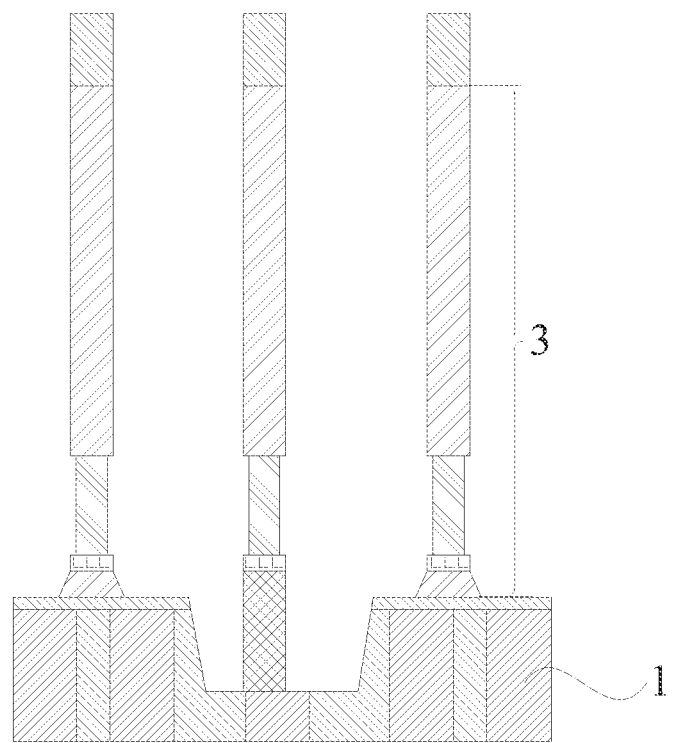
FIG. 2 is a schematic diagram of a bit line provided by the related technologies.

As described in the background art, a bit line in related technologies has a defect of tilting or necking. After research, it is found that a reason for such problem is as below. Referring to FIG. 1 and FIG. 2, in the related technologies, a stack layer 2 configured to form bit line structures is formed on a substrate 1 generally by means of a deposition process, and then the stack layer 2 is patterned to form the bit line structures 3 spaced along a first direction. However, due to larger number of film layers in the stack layer, there may be a problem of over-etching or insufficient etching under the influence of the etching process, resulting in the defect of tilting or necking of the bit line structure formed.

In view of the above technical problem, embodiments of the present disclosure provide a semiconductor structure and a method for fabricating the same. A conductive support strip is first formed on a substrate to occupy a position for a bit line structure formed subsequently, then an isolation structure is formed on a side wall of the conductive support strip, and at least a portion of the conductive support strip is removed to form the first filling region configured to fill the bit line structure. In this way, the isolation structure may be used as support, and the bit line structure is formed in the first filling region directly by means of a deposition process without removing a portion of the stack layer by means of an etching process in the related technologies, such that it may be prevented that the formed bit line structure has the necking defect of wider upper and lower parts and narrower middle or the bottom thereof is tapered, thereby improving yield of the semiconductor structure.

In this case, when the portion of the conductive support strip is removed, a remaining portion of the conductive support strip may also serve as a portion of the bit line structure. For example, the remaining portion of the conductive support strip may serve as a bit line contact in the bit line structure, such that subsequent deposition processes may be simplified.

To make the above objectives, features, and advantages of the embodiments of the present disclosure more apparent and lucid, the technical solutions in the embodiments of the present disclosure will be described clearly and completely below with reference to the accompanying drawings in the embodiments of the present disclosure. Apparently, the described embodiments are merely some but not all of the embodiments of the present disclosure. All other embodiments obtained by persons of ordinary skill in the art based on the embodiments of the present disclosure without creative efforts shall fall within the protection scope of the present disclosure.

This embodiment does not impose restrictions on the semiconductor structure, and an introduction will be made below by taking an example where the semiconductor structure is a dynamic random access memory (DRAM), but this embodiment is not limited thereto, and the semiconductor structure in this embodiment may also be other structures.

Embodiment I

Figure 3:
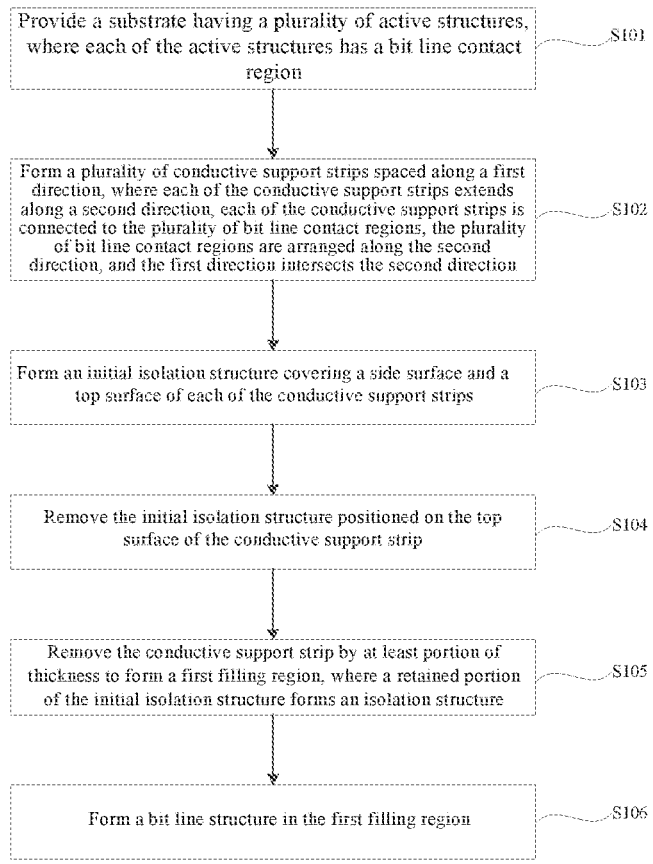
FIG. 3 is a process flow diagram I of a method for fabricating a semiconductor structure according to an embodiment of the present disclosure.

Referring to FIG. 3, the method for fabricating the semiconductor structure provided by the embodiment of the present disclosure includes following steps.

Step S101: providing a substrate having a plurality of active structures, where each of the plurality of active structures has a bit line contact region.

A substrate 100 is configured to support a semiconductor device disposed thereon. The substrate 100 may be a silicon (Si) substrate, a germanium (Ge) substrate, a silicon germanium (GeSi) substrate, a silicon carbide (SiC) substrate, a silicon on insulator (SOI) substrate or a germanium on insulator (GOI) substrate, etc.

Figure 4:
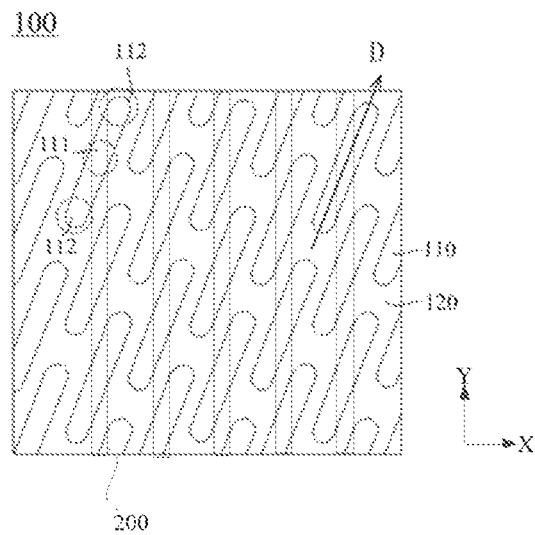
FIG. 4 is a layout diagram of a substrate and a conductive support strip in the method for fabricating the semiconductor structure according to an embodiment of the present disclosure.
Figure 5:
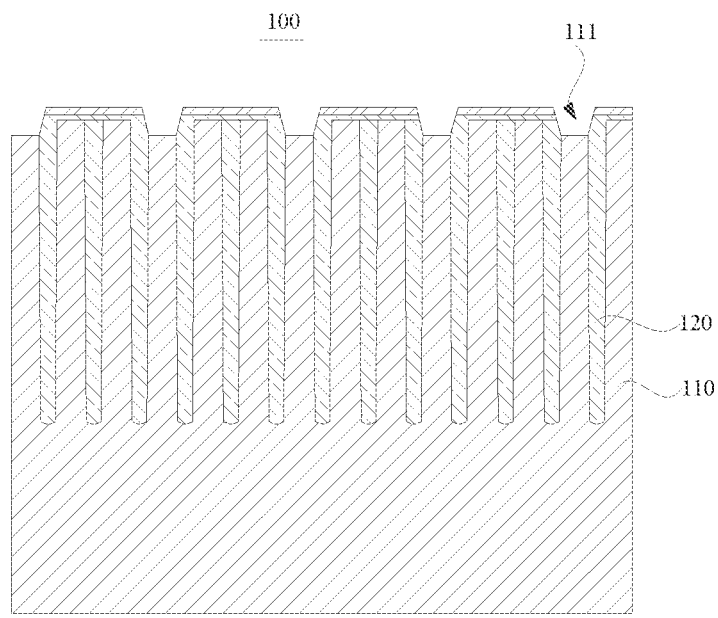
FIG. 5 is a schematic diagram of forming a bit line contact region in the method for fabricating the semiconductor structure according to an embodiment of the present disclosure.

Referring to FIG. 4 and FIG. 5, there are a plurality of active structures 110 in the substrate 100, the plurality of active structures 110 may be arranged in an array, and each active structure 110 is arranged obliquely and extends along a direction D shown in FIG. 4. Moreover, the plurality of active structures 110 may be spaced from each other by means of shallow trench isolation (STI) structures 120, to ensure that the active structures 110 are independent of each other. For example, a shallow trench is formed in the substrate by means of a patterning fabrication process, and an insulating material is filled into the shallow trench to define, on the substrate 100, the plurality of active structures 110 separated by the STI structure. The patterning fabrication process may be a self-aligned double patterning (SADP) process or a self-aligned quadruple patterning (SAQP) process. The insulating material may include silicon oxide, but is not limited thereto.

Each active structure 110 has a bit line contact region 111 therein. That is, a bottom of the bit line contact region 111 is positioned in the substrate 100, and the bit line contact region 111 is configured to form a bit line contact (BLC) to achieve electrical connection between the bit line structure 600 and the active structure 110. It should be understood that the plurality of bit line contact regions 111 are arranged in an array.

It should be noted that the capacitor contact region 112 is further arranged in each active structure 110. There may be two capacitor contact regions 112, and the two capacitor contact regions 112 are respectively arranged on two sides of the bit line contact region 111 and are configured to form capacitor contacts to achieve electrical connection between the capacitor structure and the active structure 110.

Step S102: forming a plurality of conductive support strips spaced along a first direction, where each of the plurality of conductive support strips extends along a second direction, each of the plurality of conductive support strips is connected to the plurality of bit line contact regions, the plurality of bit line contact regions are arranged along the second direction, and the first direction and the second direction intersect with each other.

With continued reference to FIG. 4, each conductive support strip 200 extends along the second direction, where the second direction intersects an extension direction of the active structure 110, such that each conductive support strip 200 connects the plurality of bit line contact regions 111 positioned on the same column. The first direction is an X direction in FIG. 4, and the second direction is a Y direction in FIG. 4.

Figure 6:
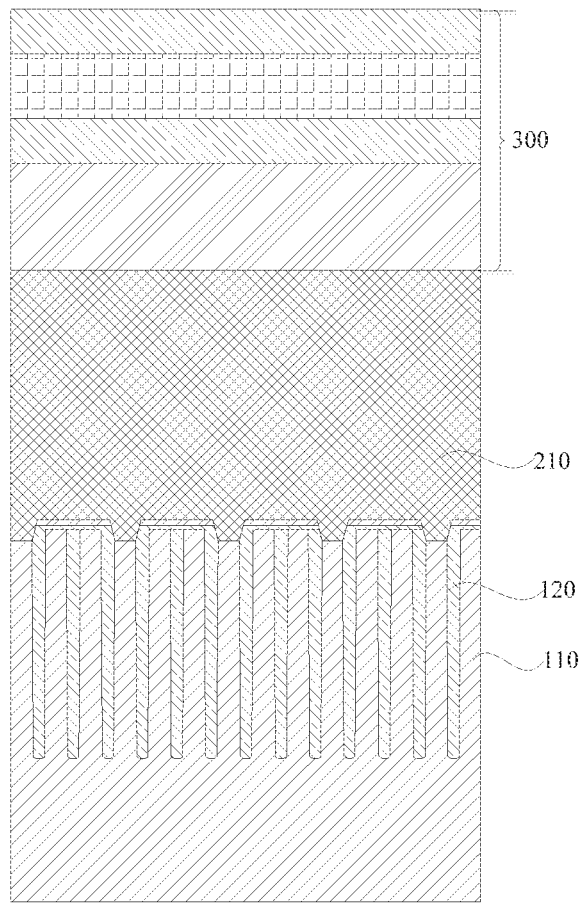
FIG. 6 is a schematic diagram I of forming a conductive support layer in the method for fabricating the semiconductor structure according to an embodiment of the present disclosure.

As an example, referring to FIG. 6, a conductive support layer 210 is formed on the substrate, where the conductive support layer 210 covers an upper surface of the substrate 100 and fills up the bit line contact region 111.

The conductive support layer 210 is formed in the bit line contact region 111 by means of chemical vapor deposition (CVD), physical vapor deposition (PVD) or atomic layer deposition (ALD), where the conductive support layer 210 also extends outside the bit line contact region 111 and covers the upper surface of the substrate 100.

Figure 7:
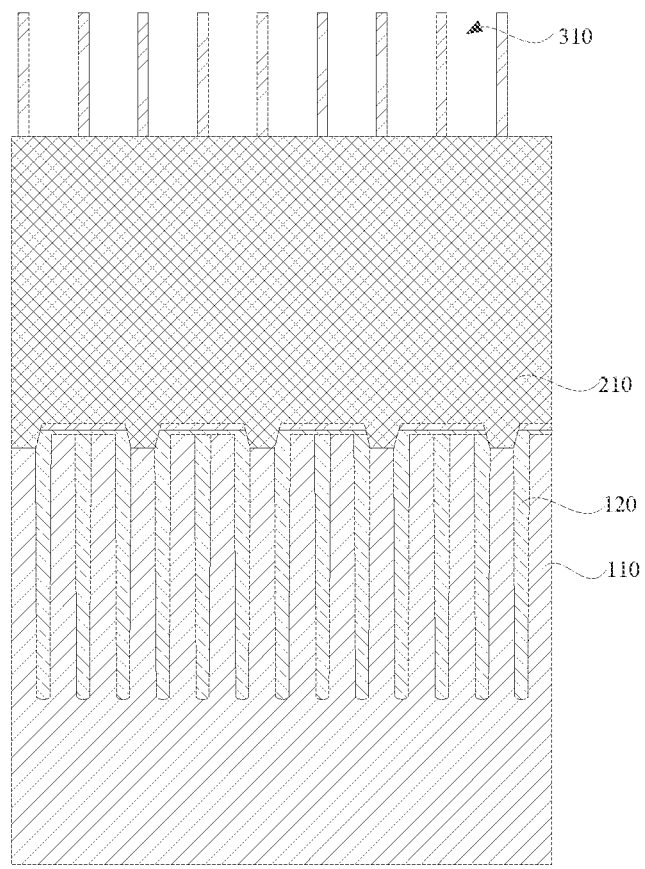
FIG. 7 is a schematic diagram I of patterning a mask layer in the method for fabricating the semiconductor structure according to an embodiment of the present disclosure.
Figure 8:
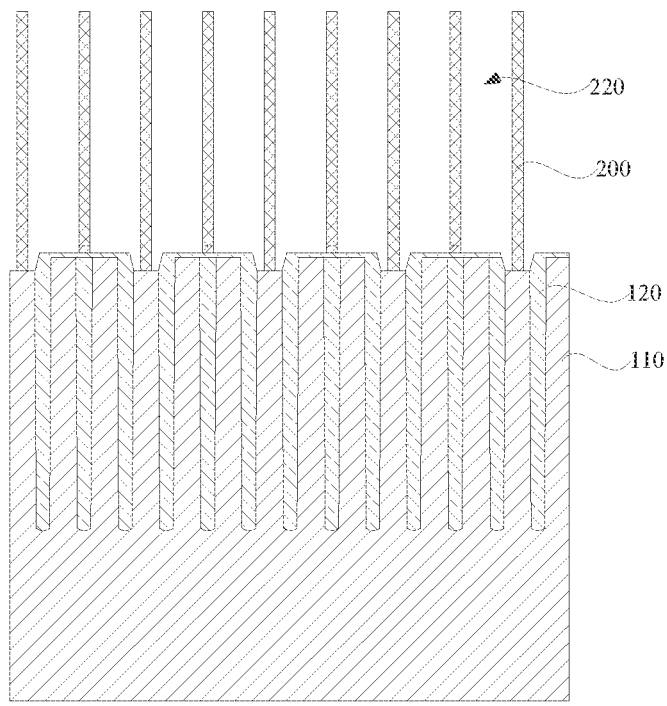
FIG. 8 is a schematic diagram I obtained after forming a conductive support layer in the method for fabricating the semiconductor structure according to an embodiment of the present disclosure.

Next, referring to FIG. 7 and FIG. 8, the conductive support layer 210 is patterned to form a plurality of conductive support strips 200 spaced along the first direction, where each of the plurality of conductive support strips 200 is spaced from a side wall of each of the plurality of bit line contact regions. A groove 220 is formed between adjacent conductive support strips 200, where a depth direction of the groove 220 is perpendicular to the substrate 100.

With continued reference to FIGS. 5 to 8, a mask layer 300 is formed in the conductive support layer, the mask layer 300 is patterned by means of the SADP process to form a mask pattern 310 in the mask layer 300, and the conductive support layer 210 is etched using the mask pattern 310 as a mask to form the plurality of conductive support strips 200 arranged at intervals along the first direction. In some embodiments, reference may be made to the description in the related technologies for the SADP process, which is not to be described in detail in this embodiment.

It should be noted that for the same conductive support strip 200, a bottom of a portion of the conductive support strip 200 is positioned in the bit line contact region 111, and a bottom of a remaining portion of the conductive support strip 200 is positioned on the substrate 100. A preset distance is provided between the conductive support strip 200 positioned in the bit line contact region 111 and a side wall of the bit line contact region 111, such that an isolation material may be formed in this region subsequently, to prevent the subsequently formed bit line contact from being electrically connected to other semiconductor device positioned in the substrate.

Step S103: forming an initial isolation structure covering a side surface and a top surface of each of the plurality of conductive support strips.

Figure 9:
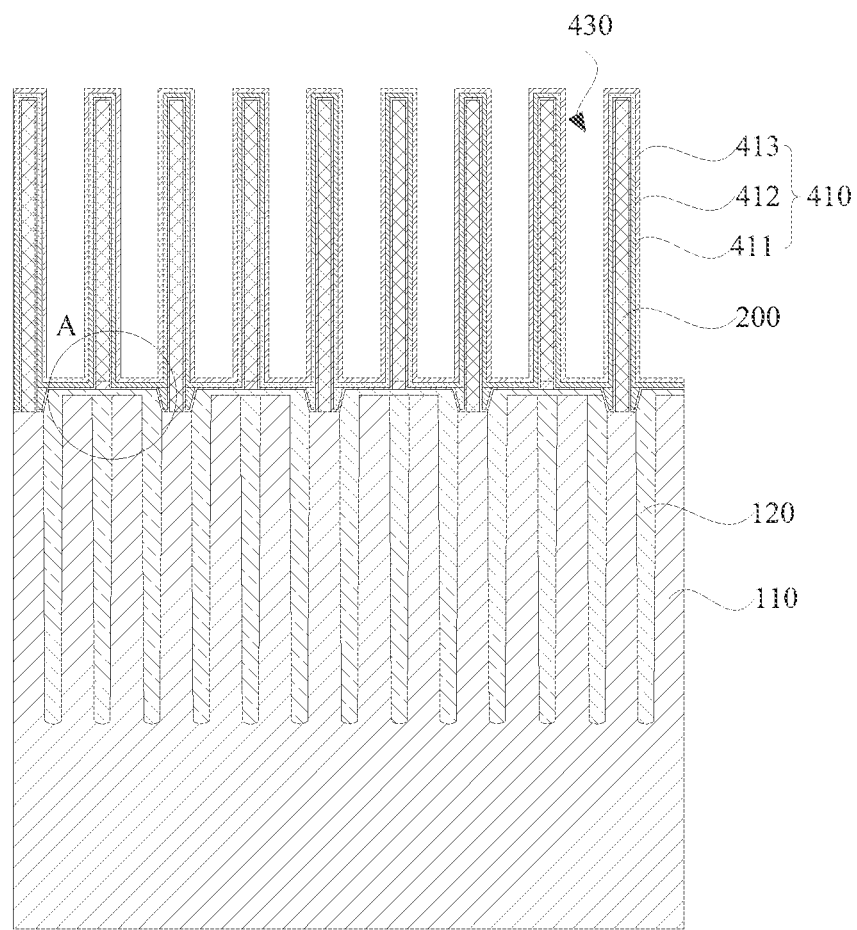
FIG. 9 is a schematic diagram I obtained after forming an initial isolation spacer in the method for fabricating the semiconductor structure according to an embodiment of the present disclosure.
Figure 10:
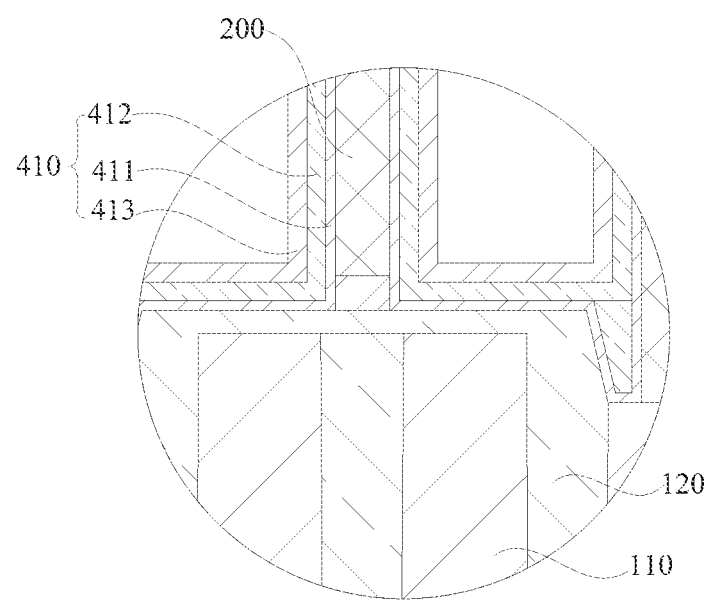
FIG. 10 is an enlarged schematic view of Region A in FIG. 9.

For example, referring to FIG. 9 and FIG. 10, an initial isolation spacer 410 covering the side surface and the top surface of each conductive support strip 200 is formed, where the initial isolation spacer 410 defines a groove 430 between every two adjacent conductive support strips 200. The initial isolation spacer 410 includes a first initial isolation layer 411, a second initial isolation layer 412 and a third initial isolation layer 413, where the second initial isolation layer 412 is positioned between the first initial isolation layer 411 and the third initial isolation layer 413, and the first initial isolation layer 411 is connected to the conductive support strip 200.

The first initial isolation layer 411 and the third initial isolation layer 413 have the same material, including but not limited to silicon nitride. A material of the second initial isolation layer 412 includes silicon oxide, but is not limited thereto.

Figure 11:
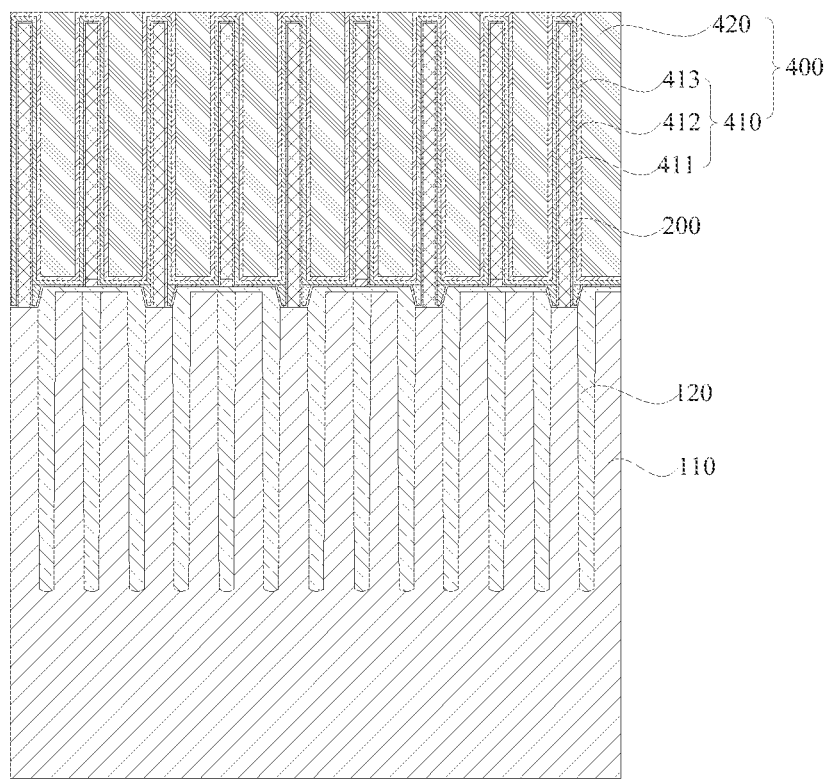
FIG. 11 is a schematic diagram I obtained after forming an initial isolation structure in the method for fabricating the semiconductor structure according to an embodiment of the present disclosure.

Thereafter, referring to FIG. 11, an initial dielectric layer 420 is formed in the groove 430 by means of a deposition process, where the initial dielectric layer 420 fills up the groove 430. A top surface of the initial dielectric layer 420 is flush with that of the initial isolation spacer 410. That is, the top surface of the initial dielectric layer 420 is flush with that of the third initial isolation layer 413.

The initial dielectric layer 420 and the initial isolation spacer 410 constitute an initial isolation structure 400. A material of the initial dielectric layer 420 includes silicon oxide, but is not limited thereto.

Step S104: removing the initial isolation structure positioned on the top surface of the conductive support strip.

Figure 12:
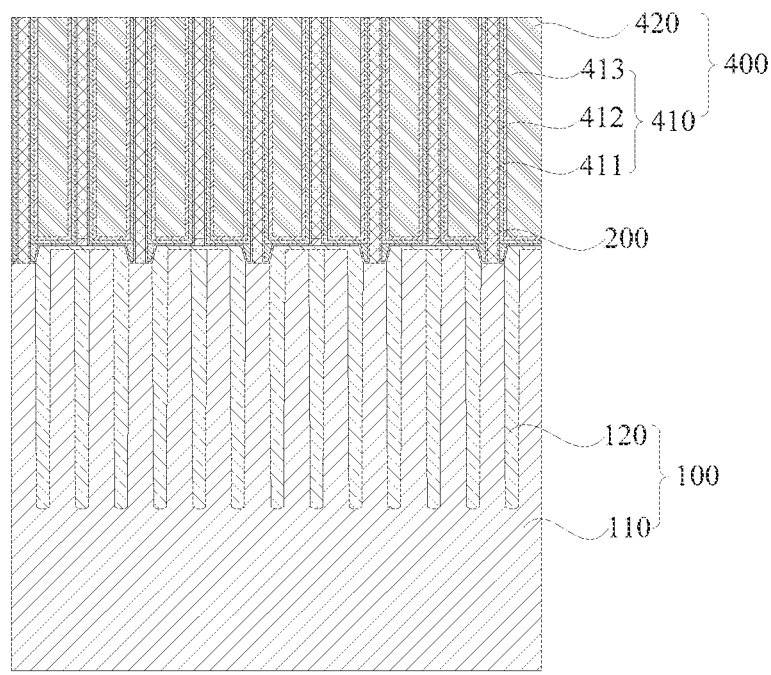
FIG. 12 is a schematic diagram I obtained after removing a portion of the initial isolation structure in the method for fabricating the semiconductor structure according to an embodiment of the present disclosure.

Referring to FIG. 12, for example, the initial isolation structure 400 positioned on the top surface of the conductive support strip 200 and an initial dielectric layer 420 positioned in the same layer as this portion of the initial isolation structure 400 are removed by means of chemical mechanical polishing (CMP), and the top surface of the conductive support strip 200 is exposed after this portion of the initial isolation structure 400 is removed.

Step S105: removing the conductive support strip by at least a portion of thickness to form a first filling region, where a retained portion of the initial isolation structure forms an isolation structure.

Figure 13:
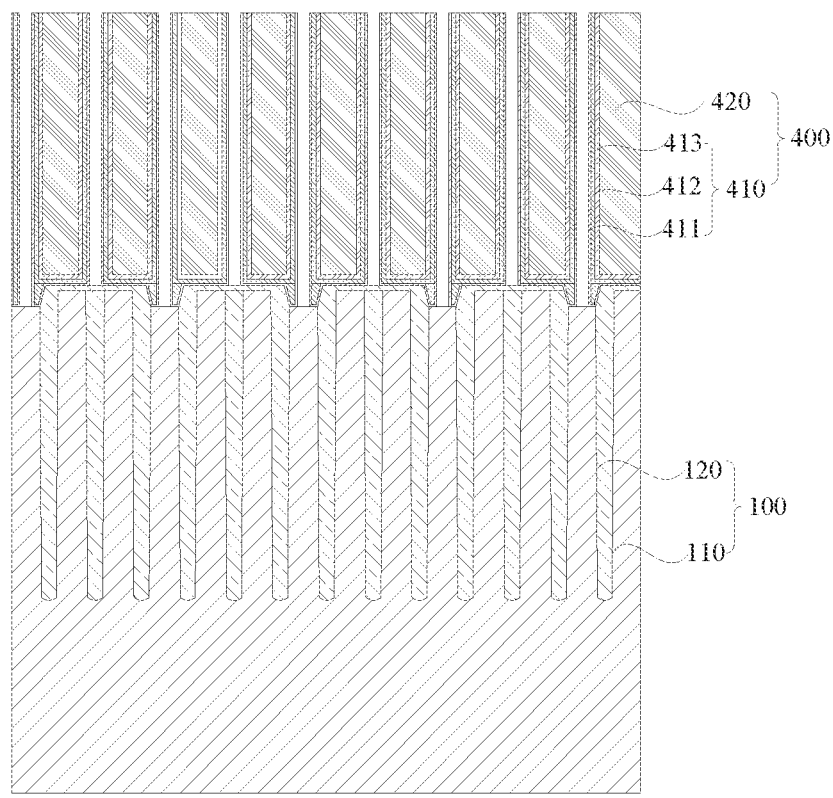
FIG. 13 is a schematic diagram obtained after removing all the conductive support strip in the method for fabricating the semiconductor structure according to an embodiment of the present disclosure.
Figure 29:
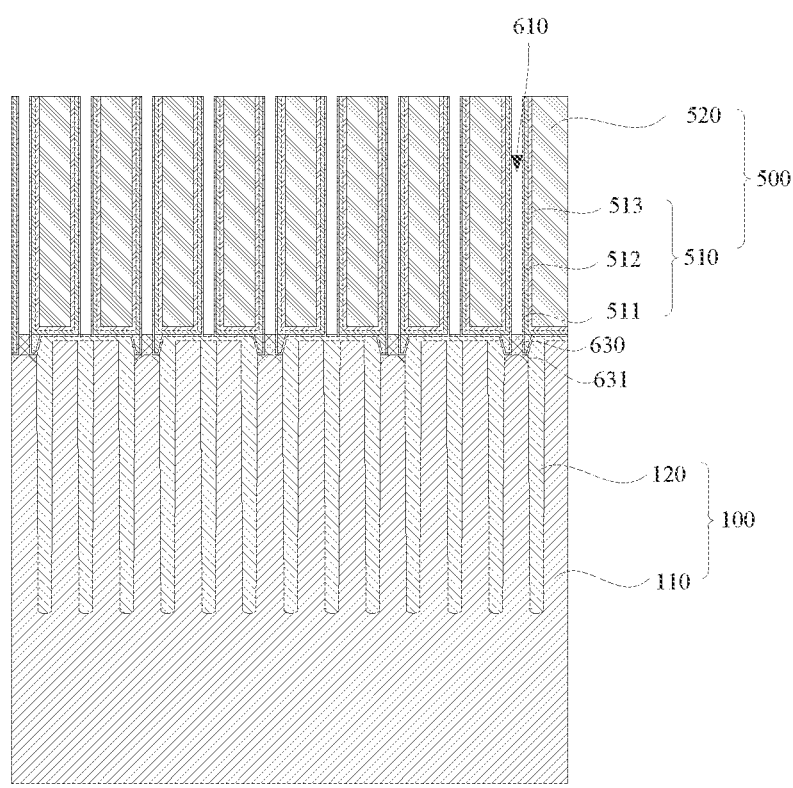
FIG. 29 is a schematic diagram obtained after removing a portion of the conductive support strip in the method for fabricating the semiconductor structure according to an embodiment of the present disclosure.

Referring to FIG. 13 and FIG. 29, at least a portion of the conductive support strip 200 positioned below the initial isolation structure 400 is removed by means of an etching process, to form a first filling region 610 configured to form a bit line structure.

Figure 14:
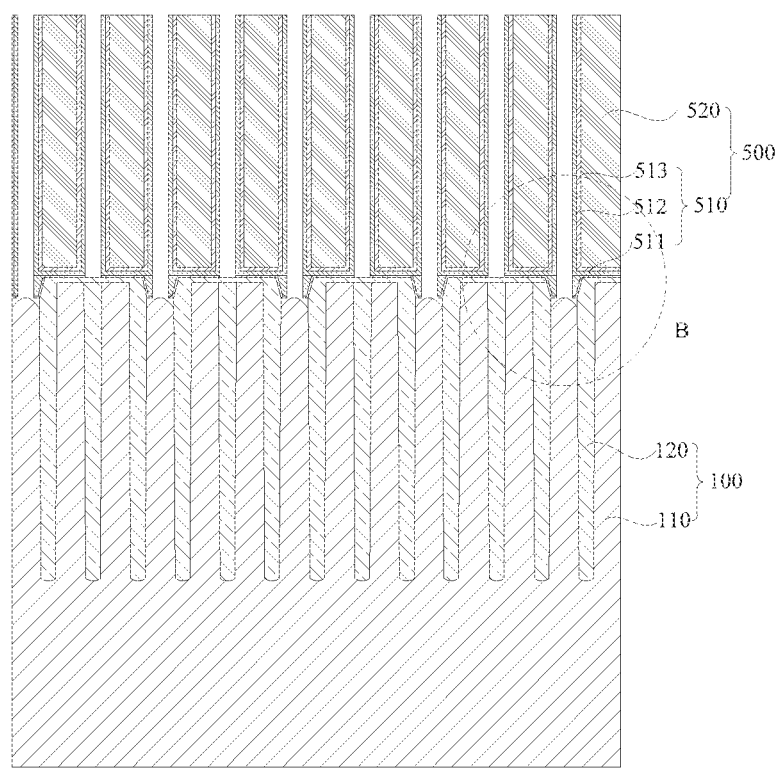
FIG. 14 is a schematic diagram I obtained after removing a portion of the initial isolation structure in the method for fabricating the semiconductor structure according to an embodiment of the present disclosure.

In this step, with continued reference to FIG. 13 and FIG. 14, if all of the conductive support strip 200 is removed, the first filling region 610 is jointly defined by the isolation structure 500 and the bit line contact region 111 in this case. That is, the bit line contact region 111 serves as a portion of the first filling region 610.

Figure 32:
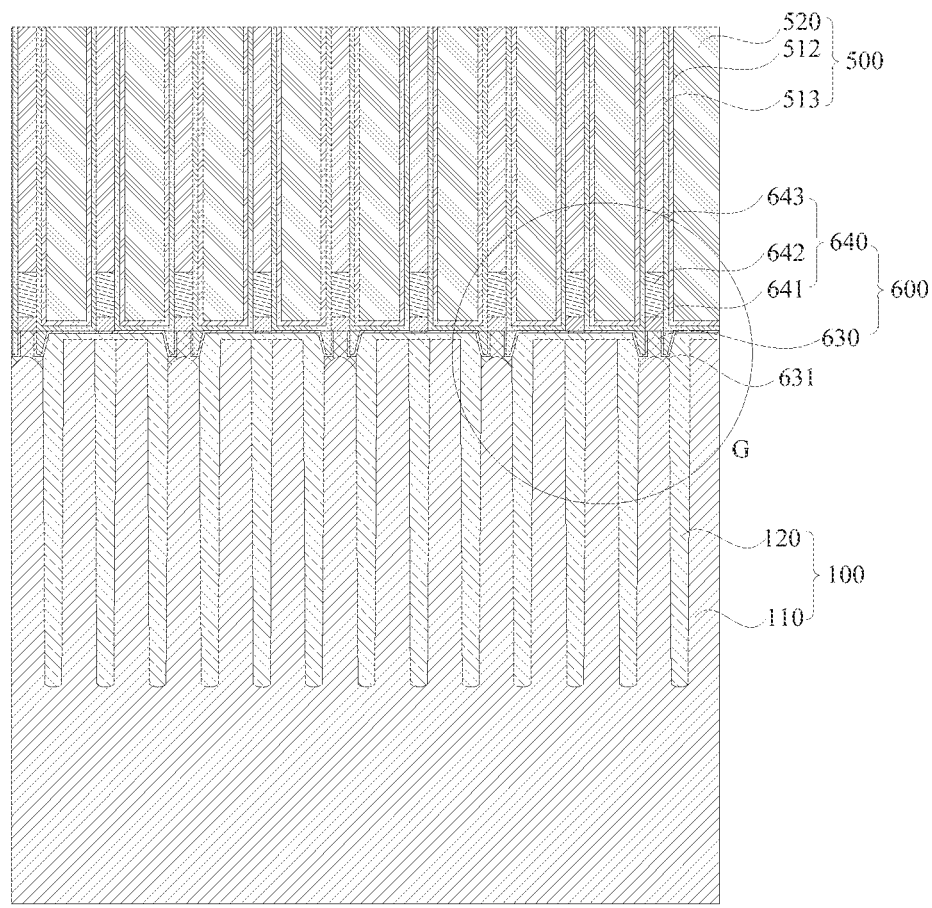
FIG. 32 is a schematic diagram II obtained after forming the bit line structure in the method for fabricating the semiconductor structure according to an embodiment of the present disclosure.

Referring to FIG. 29, if a portion of the conductive support strip 200 is removed and at least the conductive support strip 200 positioned in the bit line contact region 111 is retained, the retained portion of the conductive support strip 200 may serve as a bit line contact 630 in the bit line structure 600 (referring to FIG. 32). In this case, the first filling region 610 is defined by the isolation structure 500.

It is to be noted that after the step of removing the conductive support strip by at least a portion of thickness and before the step of forming the bit line structure in the first filling region, the method for fabricating the semiconductor structure further comprises following steps.

Figure 15:
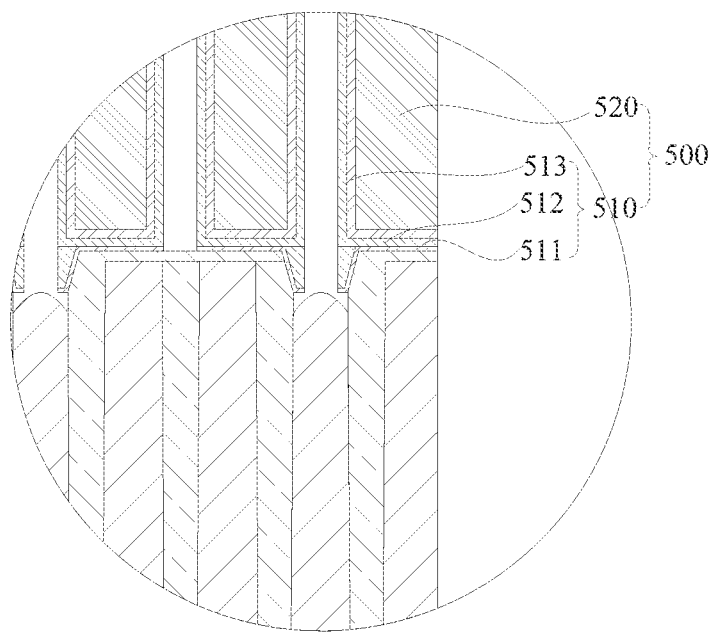
FIG. 15 is an enlarged schematic view of Region B in FIG. 14.

Referring to FIG. 14 and FIG. 15, a portion of the side wall of the initial isolation structure 400 exposed by the first filling region 610 is removed along the first direction, to enlarge the width of the first filling region 610 in the first direction. Based on such arrangement, by removing the initial isolation structure 400 by a portion of width to enlarge the width of the first filling region in the first direction, the width of the bit line structure formed subsequently may be increased, thereby reducing resistance of the bit line structure and improving sensitivity of the semiconductor structure.

In this embodiment, a portion of the first initial isolation layer 411 may be removed along the first direction, and of course, all of the first initial isolation layer 411 may be removed along the first direction, as long as insulation performance of the isolation spacer formed subsequently can be ensured, and an area of the first filling region can be increased.

The retained portion of the initial isolation structure 400 constitutes an isolation structure 500. The isolation structure 500 includes an isolation spacer 510 and a dielectric layer 520. The isolation spacer 510 includes a first isolation layer 511, a second isolation layer 512 and a third isolation layer 513 which are stacked.

Figure 16:
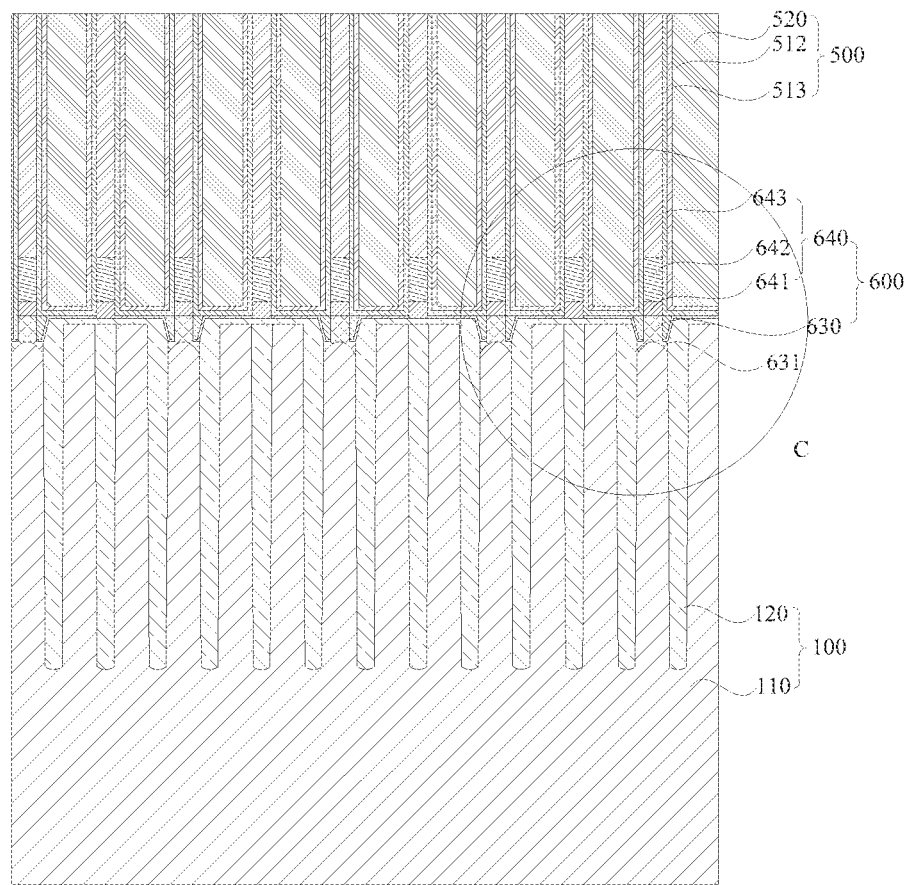
FIG. 16 is a schematic diagram I obtained after forming a bit line structure in the method for fabricating the semiconductor structure according to an embodiment of the present disclosure.
Figure 17:
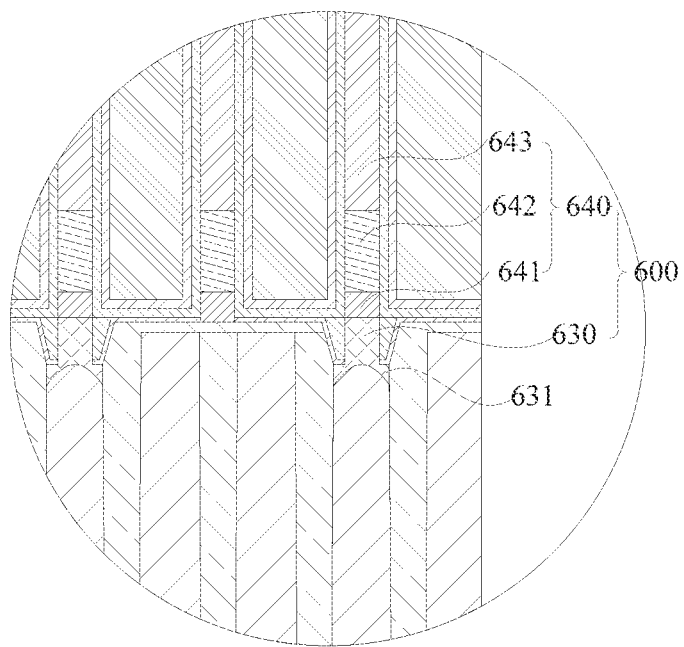
FIG. 17 is an enlarged schematic view of Region C in FIG. 16.

Step S106: forming a bit line structure in the first filling region. Reference is made to FIG. 16 and FIG. 17 for the bit line structure.

In the embodiments of the present disclosure, the conductive support strip 200 is first formed on the substrate 100 to occupy a position for the bit line structure 600 formed subsequently, then the isolation structure 500 is formed on the side wall of the conductive support strip 200, and at least a portion of the conductive support strip 200 is removed to form the first filling region 610 configured to fill the bit line structure. In this way, the isolation structure 500 may be used as support, and the bit line structure 600 is formed in the first filling region 610 directly by means of a deposition process without using an etching process, such that it may be prevented that the formed bit line structure 600 has the necking defect of wider upper and lower parts and narrower middle or the bottom thereof is tapered, thereby improving yield of the semiconductor structure.

In this case, when a portion of the conductive support strip 200 is removed, a remaining portion of conductive support strip 200 may also serve as the bit line contact in the bit line structure 600, such that subsequent deposition processes can be simplified.

In view of a material of the conductive support strip 200 and the thickness of the conductive support strip 200 subsequently removed, this embodiment has different implementations. The method for fabricating the semiconductor structure may be described in detail below in two different embodiments.

First Embodiment

Figure 18:
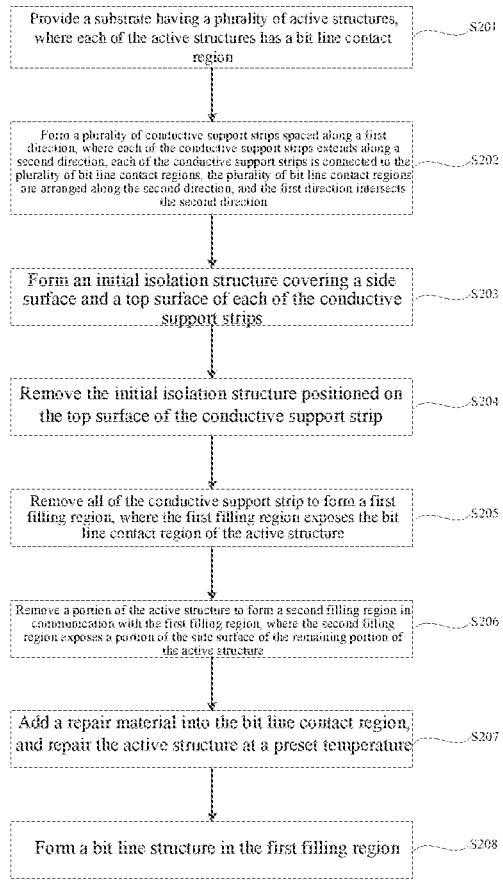
FIG. 18 is a process flow diagram II of the method for fabricating a semiconductor structure according to an embodiment of the present disclosure.

Referring to FIG. 18, the method for fabricating the semiconductor structure provided by the embodiment of the present disclosure includes following steps.

Step S201: providing a substrate having a plurality of active structures, where each of the plurality of active structures has a bit line contact region.

Step S202: forming a plurality of conductive support strips spaced along a first direction, where each of the plurality of conductive support strips extends along a second direction, each of the plurality of conductive support strips is connected to the plurality of bit line contact regions, the plurality of bit line contact regions are arranged along the second direction, and the first direction and the second direction intersect with each other.

Step S203: forming an initial isolation structure covering a side surface and a top surface of each of the plurality of conductive support strips.

Step S204: removing the initial isolation structure positioned on the top surface of the conductive support strip.

The above Steps S201 to S204 are the same as the Steps S101 to S104 in the above embodiment, and thus are not to be described in this embodiment.

Step S205: removing all of the conductive support strip to form a first filling region, where the first filling region exposes the bit line contact region of the active structure.

In this case, the material of the conductive support strip 200 is undoped polysilicon. The first filling region 610 is jointly defined by the isolation structure 500 and the bit line contact region 111. That is, the bit line contact region 111 serves as a portion of the first filling region 610.

Step S206: removing a portion of the active structure to form a second filling region in communication with the first filling region, where the second filling region exposes a portion of the side surface of the remaining portion of the active structure.

Figure 19:
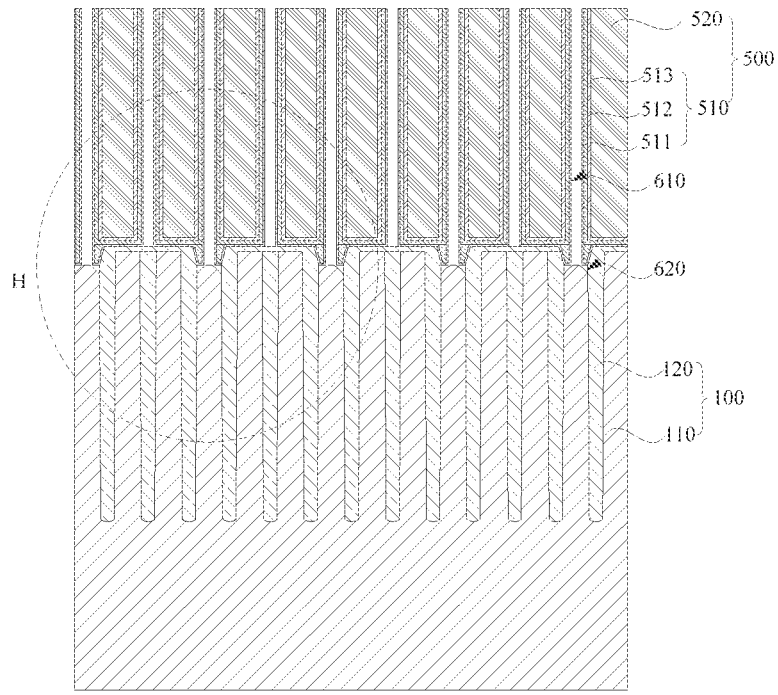
FIG. 19 is a schematic diagram I obtained after forming a second filling region according to the method for fabricating the semiconductor structure according to an embodiment of the present disclosure.
Figure 20:
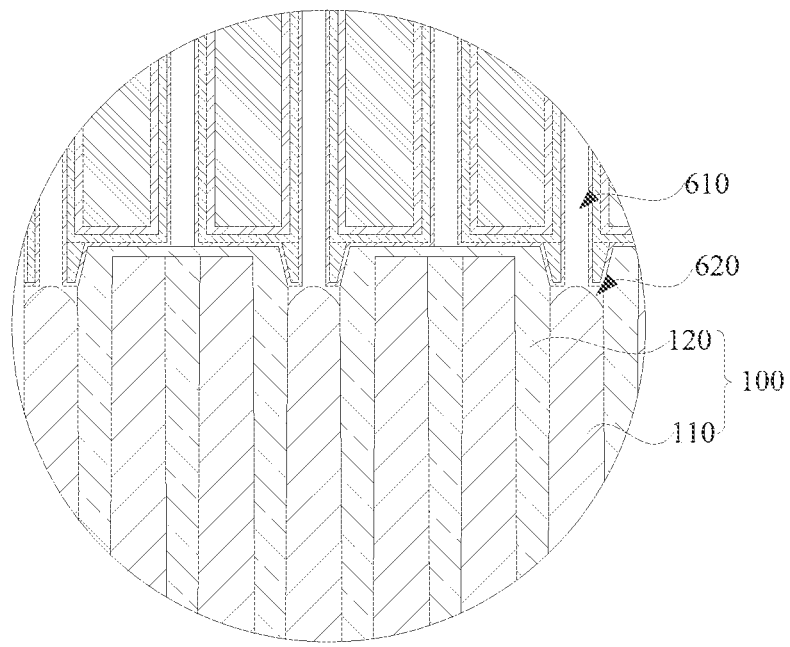
FIG. 20 is an enlarged schematic view of Region H in FIG. 19.

Referring to FIG. 19 and FIG. 20, when the active structure 110 has a greater etching selectivity with respect to the isolation structure 500, the active structure 110 exposed in the bit line contact region 111 may be etched under the same etching condition. That is, the active structure 110 exposed in the bit line contact region 111 is removed by portion of thickness, such that the remaining portion of the active structure 110 forms a shape higher in the middle and lower at two sides. The second filling region 620 is defined between the remaining portion of the active structure 110 and the shallow trench isolation structure 120.

After the second filling region is formed, the surface of the exposed active structure may be cleaned by means of the cleaning process to remove residual impurities on the surface of the active structure and further enlarge the volume of the second filling region.

Step S207: adding a repair material into the bit line contact region, and repairing the active structure at a preset temperature.

It should be noted that when the repair material is added into the bit line contact region 111, the repair material also fills up the second filling region 620, so the active structure 110 exposed in the bit line contact region 111 and the second filling region 620 may be repaired.

Repair in this step may refer to crystal lattice repair or surface repair, for example, reducing roughness of the active structure.

For example, the repair material may include any one of oxygen, hydrogen, or nitrogen. When the repair material is the oxygen, the active structure 110 exposed in the second filling region 620 and the bit line contact region is annealed at 90-120° C. The oxygen may treat the surface of the active structure 110 to reduce the surface roughness of the active structure.

When the repair material is the hydrogen or the nitrogen, the hydrogen or the nitrogen may serve as the protective gas to anneal the active structure 110 at 300-500° C. to remove the carbon or oxygen material on the surface of the active structure exposed in the second filling region 620 and the bit line contact region, and the crystal lattice damage of the active structure 110 is repaired, to improve the quality and fabrication efficiency of the subsequently formed film layer and reduce the crystal lattice defects.

Step S208: forming a bit line structure in the first filling region.

With continued reference to FIG. 16 and FIG. 17, a bit line contact 630 and a bit line 640 stacked are formed in the first filling region 610, where the bit line 640 and bit line contact 630 constitute the bit line structure 600.

For example, the bit line contact 630 is formed in the second filling region and the portion of the first filling region; and the extension portion 631 is provided at the end of the bit line contact 630 close to the substrate 100, and the extension portion 631 fills up the second filling region to cover the side surface of the active structure 110 exposed in the second filling region. The material of the bit line contact 630 is doped polysilicon.

Compared with the related technologies, the extension portion 631 is added on the basis of the bit line contact 630, such that there is also the contact surface between the extension portion 631 and the active structure 110 to increase the contact area between the bit line contact 630 and the active structure 110, thereby reducing the contact resistance between the bit line contact 630 and the active structure 110.

Moreover, in this embodiment, the bit line contact 630 is formed directly by means of the deposition process before the portion of the side wall of the initial isolation structure exposed by the first filling region is removed along the first direction, such that the damage to the bit line contact during removal of the initial isolation structure 400 may be prevented, thereby ensuring the electrical conductivity of the bit line contact.

Next, the bit line 640 is formed on the bit line contact 630 by means of a deposition process, where the bit line 640 includes a bit line barrier layer 641, a bit line conductive layer 642 and a bit line insulating layer 643 which are stacked.

The bit line barrier layer 641 is disposed on the bit line contact 630. A material of the bit line barrier layer 641 includes titanium nitride, and the bit line barrier layer 641 has both conductive properties and barrier properties. For example, titanium nitride can prevent penetration between a conductive material in the bit line conductive layer 642 and the substrate 100, thus ensuring the conductive properties of the bit line 64.

The bit line conductive layer 642 is provided on the bit line barrier layer 641. A material of the bit line conductive layer 642 includes tungsten or polysilicon, where tungsten and polysilicon have better conductive properties, and thus the conductive properties of the bit line 640 can be ensured.

The bit line insulating layer 643 is disposed on the bit line conductive layer 642 to achieve electrical insulation of the bit line conductive layer 642 from other semiconductor devices subsequently disposed on the bit line insulating layer 643. A material of the bit line insulating layer 643 may include silicon nitride, but is not limited thereto.

Second Embodiment

A main difference between this embodiment and the first embodiment lies in that a portion of the conductive support strip 200 is removed, and the remaining portion of the conductive support strip 200 serves as bit line contact 630.

Figure 21:
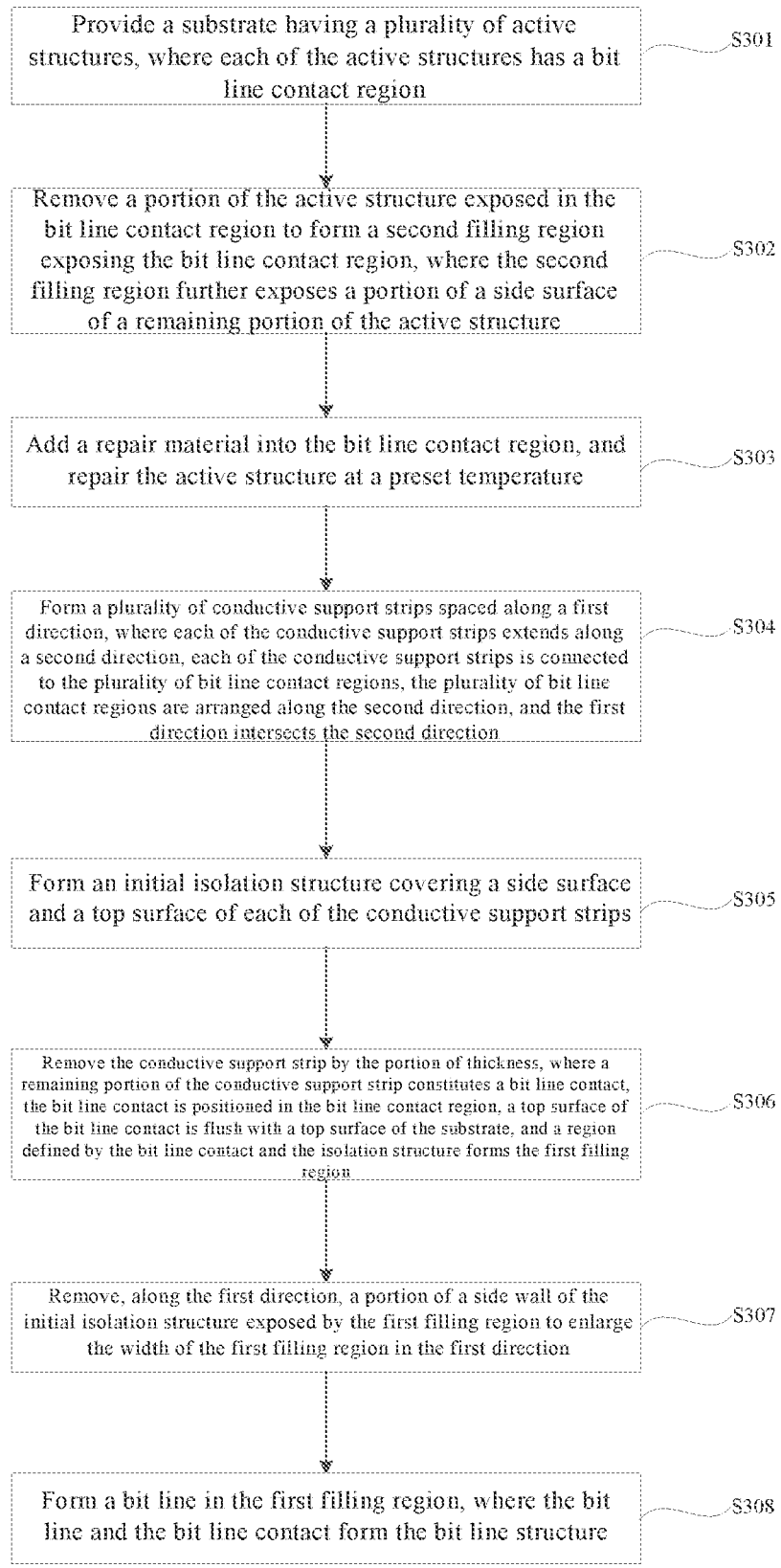
FIG. 21 is a process flow diagram III of the method for fabricating the semiconductor structure according to an embodiment of the present disclosure.

Referring to FIG. 21, the method for fabricating the semiconductor structure comprises following steps.

Step S301: providing a substrate having a plurality of active structures, where each of the plurality of active structures has a bit line contact region.

The Step S301 is the same as the Step S101 in the above embodiment, and reference may be made to the above Step S101 in detail, and thus detailed description of the Step S301 is omitted in this embodiment.

Step S302: removing a portion of the active structure exposed in the bit line contact region to form a second filling region exposing the bit line contact region, where the second filling region further exposes a portion of a side surface of a remaining portion of the active structure.

Figure 22:
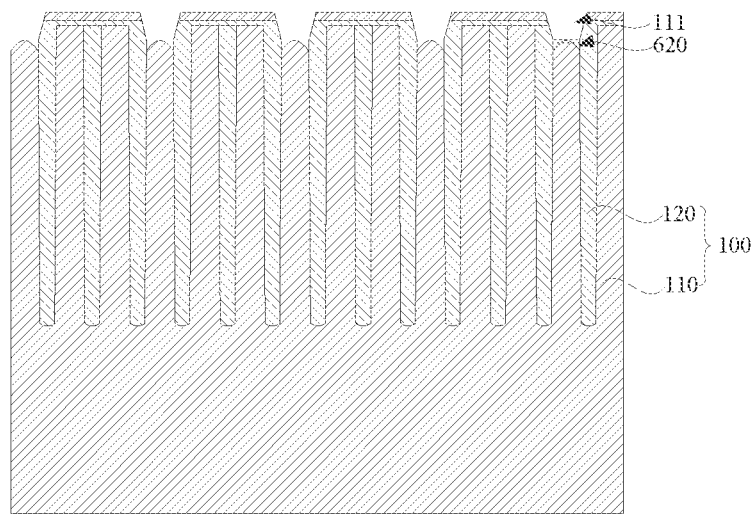
FIG. 22 is a schematic diagram II of forming a second filling region according to the method for fabricating the semiconductor structure according to an embodiment of the present disclosure.

Referring to FIG. 22, the active structure may be etched by using hydrogen fluoride or ammonia plasma as an etching gas, or an etching solution such as tetramethyl ammonium hydroxide (TMAH) may be selected to perform wet etching on the active structure. Under these etching process conditions, the active structure 110 has the greater etching selectivity with respect to the shallow trench isolation structure 120, and the active structure 110 exposed in the bit line contact region 111 may be etched. That is, the active structure 110 exposed on a periphery of the bit line contact region 111 may be removed by a portion of thickness. In addition, the remaining portion of the active structure 110 may form the shape higher in the middle and lower at the two sides based on different etching rates in different crystal orientations. The second filling region 620 is defined between the remaining portion of the active structure 110 and the shallow trench isolation structure 120.

By taking the orientation shown in FIG. 22 as an example, the region above the dashed line is the bit line contact region 111, and the region below the dashed line is the second filling region 620.

After the second filling region 620 is formed, the surface of the exposed active structure 110 may be cleaned by means of the cleaning process to remove the residual impurities on the surface of the active structure 110 and further enlarge the volume of the second filling region 620.

Step S303: adding a repair material into the bit line contact region, and repairing the active structure at a preset temperature.

It should be noted that reference may be made to Step S207 for this step, which is not to be described in detail in this embodiment.

Step S304: forming a plurality of conductive support strips spaced along a first direction, where each of the plurality of conductive support strips extends along a second direction, each of the plurality of conductive support strips is connected to the plurality of bit line contact regions, the plurality of bit line contact regions are arranged along the second direction, and the first direction and the second direction intersect with each other.

Figure 23:
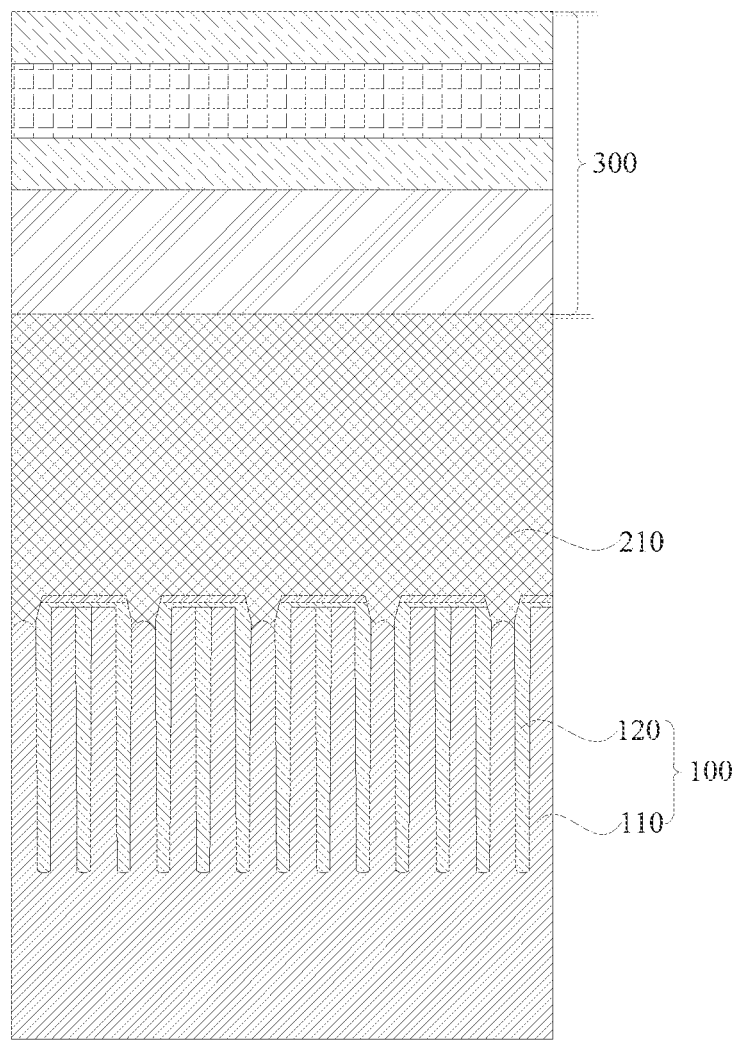
FIG. 23 is a schematic diagram II of forming a conductive support layer in the method for fabricating the semiconductor structure according to an embodiment of the present disclosure.
Figure 24:
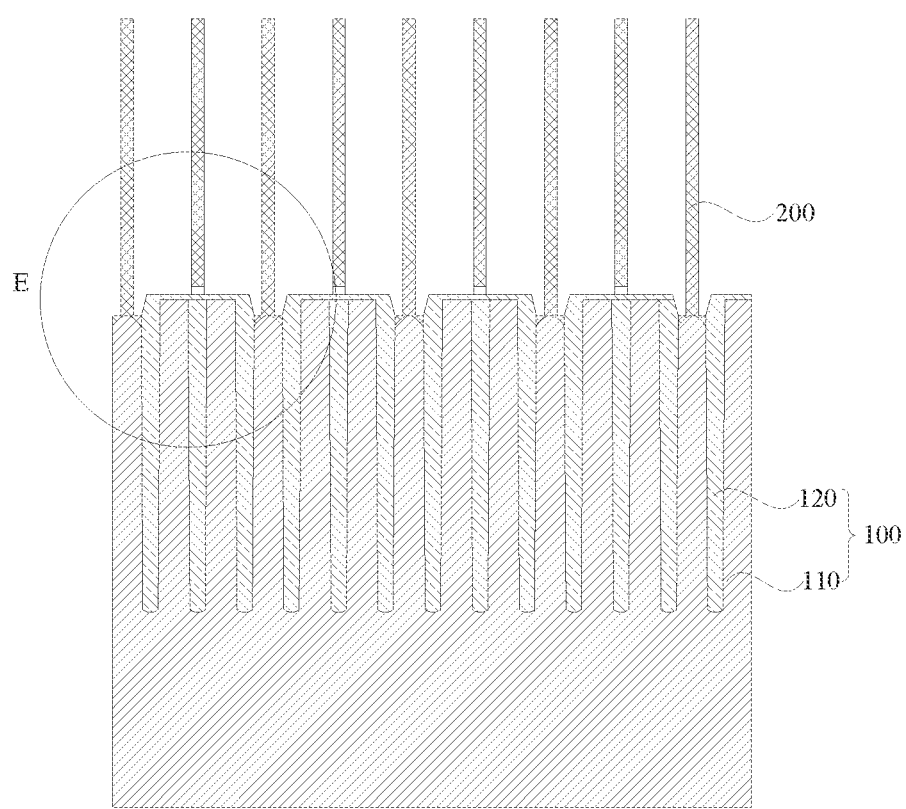
FIG. 24 is a schematic diagram II obtained after forming a conductive support strip in the method for fabricating the semiconductor structure according to an embodiment of the present disclosure.
Figure 25:
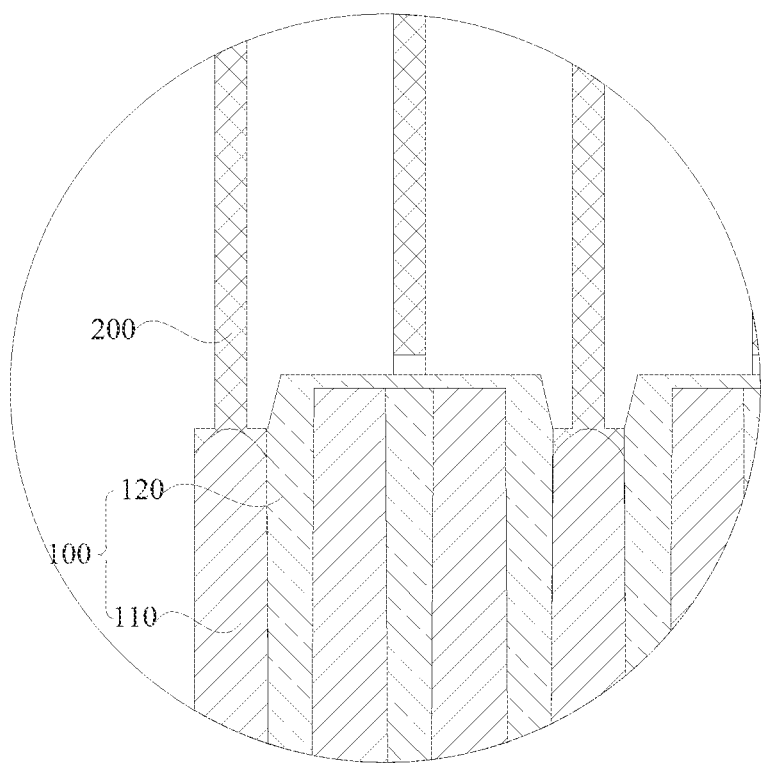
FIG. 25 is an enlarged schematic view of Region E in FIG. 24.

Referring to FIG. 23 to FIG. 25, this step is further improvement made on the basis of the Step S102, and the bottom of the conductive support strip 200 formed in this step may fill up the second filling region 620. Moreover, when the portion of the conductive support strip 200 is removed and the remaining portion of the conductive support strip 200 serves as the bit line contact 630 in the subsequent step (referring to FIG. 29), the bit line contact 630 may wrap the top surface and the portion of the side surface of the active structure 110, such that the contact area between the bit line contact 630 and the active structure 110 is increased, thereby reducing the contact resistance between the bit line contact 630 and the active structure 110, and improving the sensitivity of signal transmission of the bit line structure and the performance of the semiconductor structure.

Figure 26:
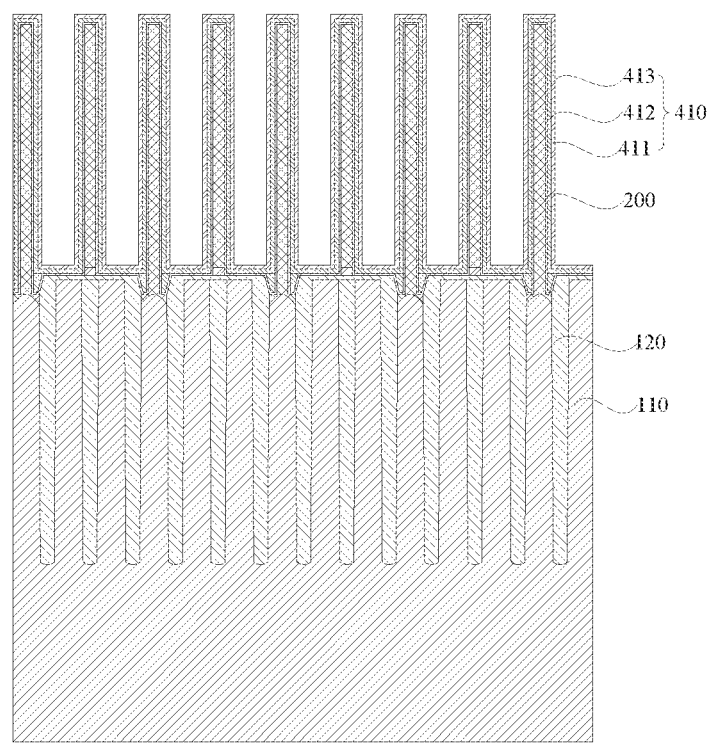
FIG. 26 is a schematic diagram II obtained after forming the initial isolation spacer in the method for fabricating the semiconductor structure according to an embodiment of the present disclosure.
Figure 27:
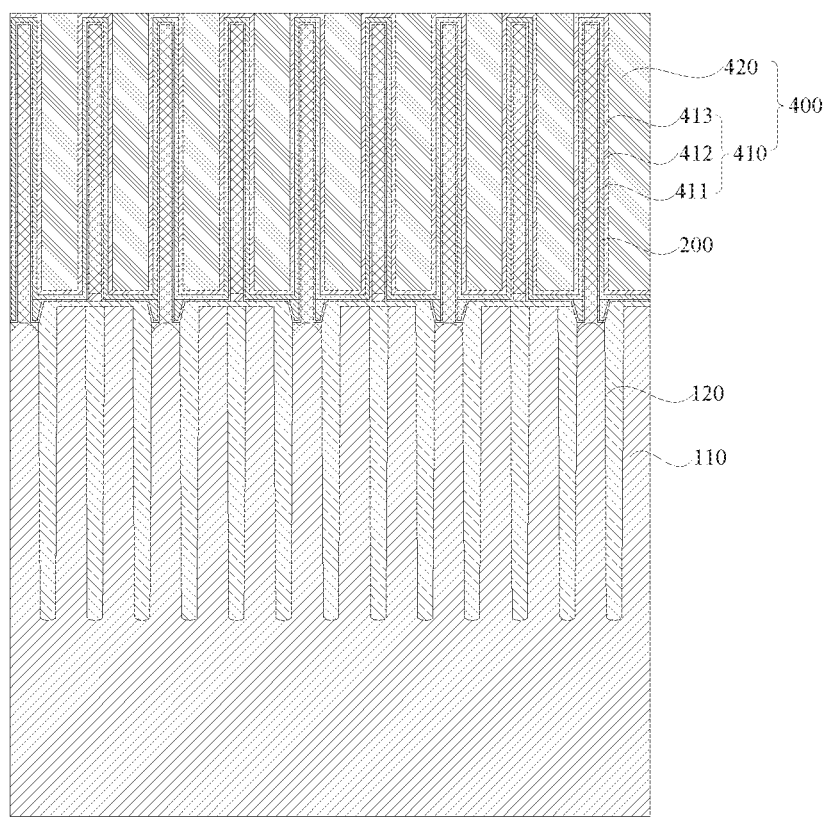
FIG. 27 is a schematic diagram II obtained after forming the initial isolation structure in the method for fabricating the semiconductor structure according to an embodiment of the present disclosure.

Step S305: forming an initial isolation structure covering a side surface and a top surface of each of the plurality of conductive support strips. Reference may be made to FIG. 26 and FIG. 27 for the initial isolation structure.

Figure 28:
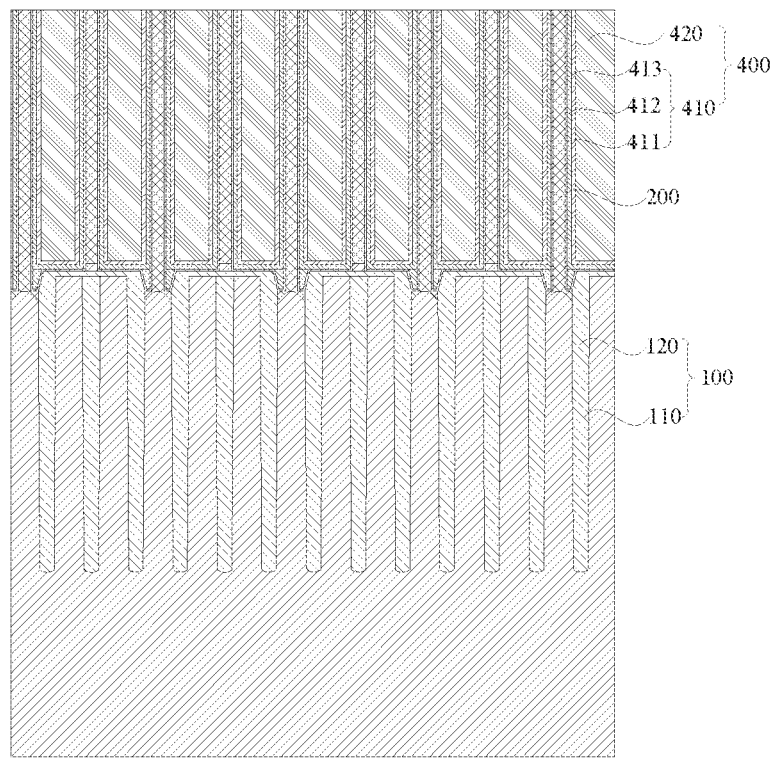
FIG. 28 is a schematic diagram II obtained after removing a portion of the initial isolation structure in the method for fabricating the semiconductor structure according to an embodiment of the present disclosure.

Step S306: removing the initial isolation structure positioned on the top surface of the conductive support strip. Reference may be made to FIG. 28 for the initial isolation structure.

It should be noted that the fabrication of Step S305 may refer to Step S103. The fabrication process of Step S306 may refer to Step S104. This embodiment does not describe in detail here.

Step S307: removing the conductive support strip by the portion of thickness, where a remaining portion of the conductive support strip constitutes a bit line contact, the bit line contact is positioned in the bit line contact region, a top surface of the bit line contact is flush with a top surface of the substrate, and a region defined by the bit line contact and the isolation structure forms the first filling region.

Referring to FIG. 29, the conductive support strip 200 positioned on the top surface of the substrate 100 is removed by means of the etching gas or the etching solution, and the conductive support strip 200 positioned in the second filling region and the bit line contact region is retained, where the retained portion of the conductive support strip 200 constitutes the bit line contact 630. The conductive support strip 200 retained in the second filling region may serve as the extension portion 631 of the bit line contact 630. Compared with the related technologies, the extension portion 631 is added on the basis of the bit line contact 630, such that there is also the contact surface between the extension portion 631 and the active structure 110 to increase the contact area between the bit line contact 630 and the active structure 110, thereby reducing the contact resistance between the bit line contact 630 and the active structure 110.

The material of the conductive support strip 200 is the doped polysilicon. Doped ions may be Group V elements in the periodic table of chemical element, for example, phosphorus ions or arsenic ions. A dopant dosage is between 8.0 E20/cm$^2$ and 20 E20/cm$^2$. Based on such arrangement, resistivity of the conductive support strip may be reduced, thereby improving the electrical conductivity of the conductive support strip.

In this embodiment, by using the portion of the conductive support strip 200 as the bit line contact 630, the subsequent deposition of the material layer configured to fabricate the bit line contact 630 is avoided, such that the subsequent deposition process may be simplified, thereby improving fabrication efficiency of the semiconductor structure.

Figure 30:
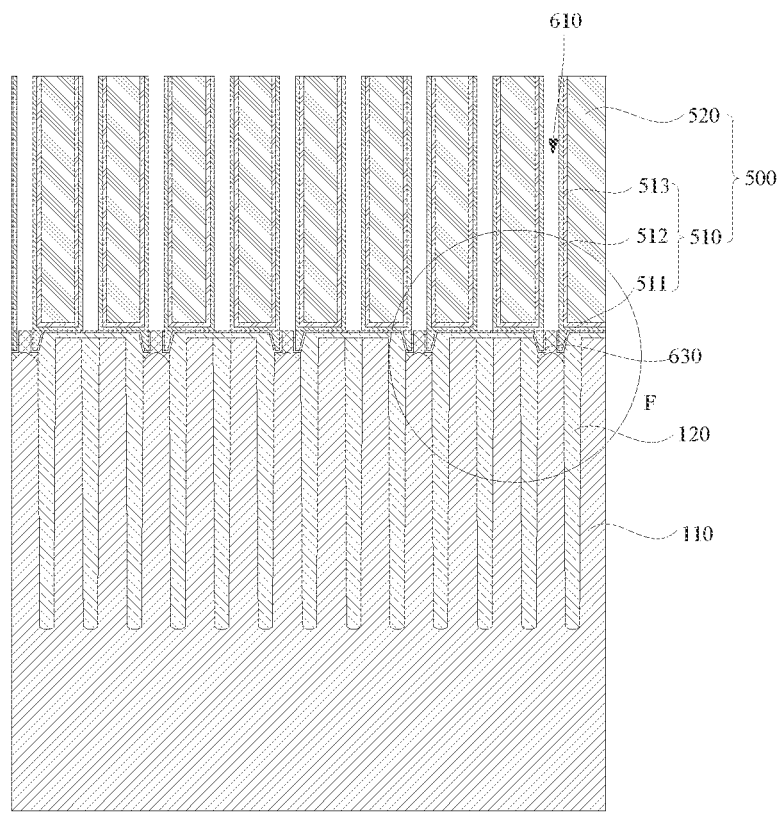
FIG. 30 is a schematic diagram II obtained after removing a side wall of a portion of the initial isolation structure in the method for fabricating the semiconductor structure according to an embodiment of the present disclosure.
Figure 31:
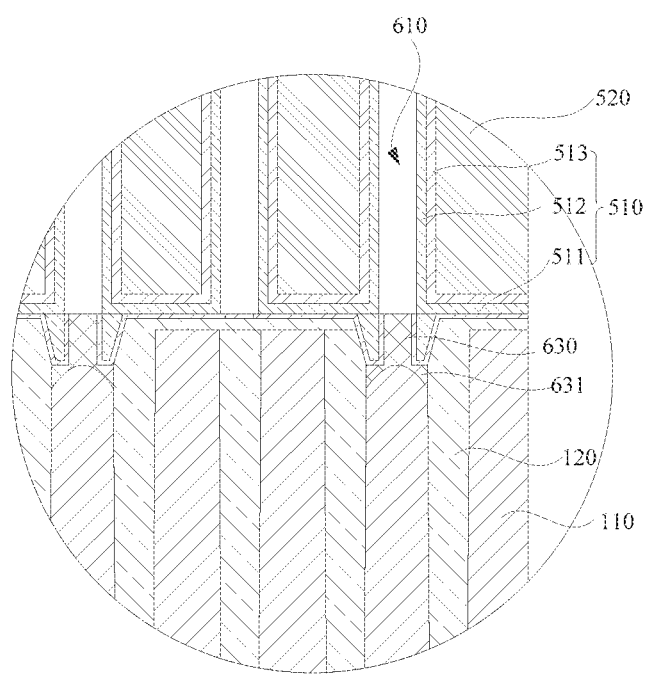
FIG. 31 is an enlarged schematic view of Region F in FIG. 30.

Step S307: removing, along the first direction, a portion of a side wall of the initial isolation structure exposed by the first filling region to enlarge the width of the first filling region in the first direction. Reference may be made to FIG. 30 and FIG. 31 for the initial isolation structure.

It should be noted that the fabrication of Step S307 may refer to Step S207. This embodiment does not describe in detail here.

Step S308: forming a bit line in the first filling region, where the bit line and the bit line contact form the bit line structure.

Figure 33:
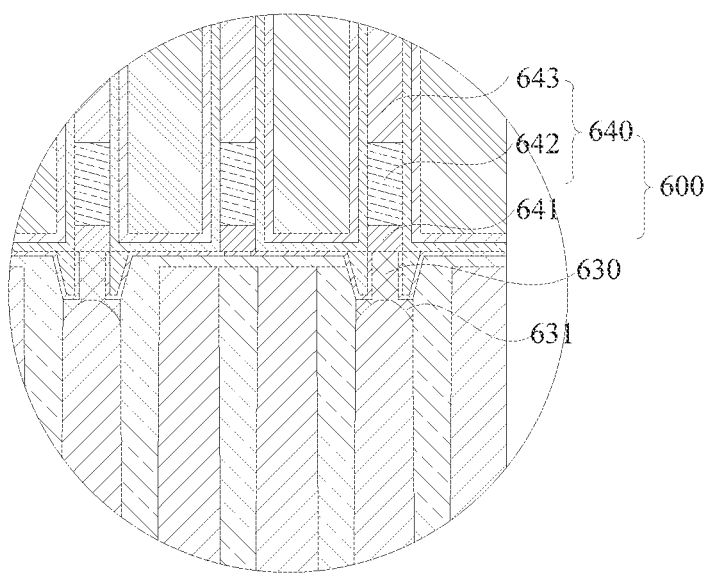
FIG. 33 is an enlarged schematic view of Region G in FIG. 32.

Referring to FIG. 32 and FIG. 33, a bit line 640 is formed within the first filling region 610 by means of a deposition process, where the bit line 640 includes a bit line barrier layer 641, a bit line conductive layer 642 and a bit line insulating layer 643 that are stacked.

Embodiment II

With continued reference to FIG. 16 and FIG. 32, the embodiment of the present disclosure provides a semiconductor structure, which is fabricated by means of the above method of the above Embodiment I. The semiconductor structure includes a substrate 100, a plurality of bit line structures 600, and an isolation structure 500.

The substrate 100 has a plurality of active structures 110 arranged in an array, where each active structure 110 is disposed obliquely. Each active structure 110 has a bit line contact region. That is, a bottom of the bit line contact region is positioned in the substrate 100, and the bit line contact region is configured to form a bit line contact (BLC) 630 to achieve electrical connection between the bit line structure 600 and the active structure 110. It should be understood that the plurality of bit line contact regions are arranged in an array.

The plurality of bit line structures 600 are spaced along the first direction, each bit line structure 600 extends along the second direction, and each bit line structure 600 is connected to the bit line contact regions positioned in the same column in the second direction. That is, each bit line structure 600 is configured to connect the active structures 110 positioned in the same column, data information in the capacitor structures positioned in the same column is read via the same bit line structure 600, or the data information is written into the capacitor structures via the same bit line structure 600 for storage.

An isolation structure 500 covers the side surface of the bit line structure 600. The isolation structure 500 is configured to implement insulation of adjacent bit line structures 600. The isolation structure 500 includes an isolation spacer 510 and a dielectric layer 520. The isolation spacer 510 covers the side surface of the bit line structure 600 and defines a groove between adjacent bit line structures 600. The dielectric layer 520 is disposed in the groove and fills up the groove.

In an embodiment, the bit line structure 600 includes a bit line contact 630 and a bit line 640 disposed on the bit line contact 630, an extension portion 631 is provided at an end of the bit line contact 630 close to the substrate, and the extension portion 631 wraps a portion of a side surface of the active structure 110. Based on this arrangement, a contact area between the bit line contact 630 and the active structure 110 may be increased, and a contact resistance between the bit line contact 630 and the active structure 110 may be reduced.

Along the first direction, the width of the bit line contact 630 may be equal to that of the bit line 640, or the width of the bit line 640 may be greater than the width of the bit line contact 630. In this way, a line width of the bit line 640 may be increased, thereby reducing the resistance of the bit line and improving the sensitivity of the semiconductor structure.

The bit line 640 includes a bit line barrier layer 641, a bit line conductive layer 642 and a bit line insulating layer 643 which are sequentially arranged in a stack, where the bit line barrier layer 641 is disposed on the bit line contact 630. Reference may be made to the description of Embodiment I for the functions of the bit line barrier layer 641, the bit line conductive layer 642 and the bit line insulating layer 643, which are not to be described in this embodiment.

The embodiments in this specification are described in a progressive manner. Each of the embodiments is focused on difference from other embodiments, and cross reference is available for identical or similar parts among different embodiments.

In the descriptions of this specification, descriptions of reference terms "one embodiment", "some embodiments", "an exemplary embodiment", "an example", "one example", or "some examples" are intended to indicate that features, structures, materials, or characteristics described with reference to the embodiment or example are included in at least one embodiment or example of the present disclosure.

The schematic representation of the above terms throughout this specification does not necessarily refer to the same embodiment or example. Furthermore, the features, structures, materials, or characteristics set forth may be combined in any suitable manner in one or more embodiments or examples.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:
    providing a substrate having a plurality of active structures, each of the plurality of active structures having a bit line contact region;
    forming a plurality of conductive support strips spaced along a first direction, each of the plurality of conductive support strips extending along a second direction, each of the plurality of conductive support strips being connected to the plurality of bit line contact regions, the plurality of bit line contact regions being arranged along the second direction, the first direction and the second direction intersecting with each other;
    forming an initial isolation structure covering a side surface and a top surface of each of the plurality of conductive support strips;
    removing the initial isolation structure positioned on the top surface of a given one of the plurality of conductive support strips;
    removing the given conductive support strip by at least portion of thickness to form a first filling region; wherein a retained portion of the initial isolation structure forms an isolation structure; and
    forming a bit line structure in the first filling region;
    wherein the removing the given conductive support strip by the at least portion of thickness comprises:
    removing the given conductive support strip by the portion of thickness, a remaining portion of the given conductive support strip constituting a bit line contact, the bit line contact being positioned in the bit line contact region, a top surface of the bit line contact being flush with a top surface of the substrate; wherein a region defined by the bit line contact and the isolation structure forms the first filling region.

2. The method for fabricating the semiconductor structure according to claim 1, wherein the forming the bit line structure in the first filling region comprises:
    forming a bit line in the first filling region, the bit line and the bit line contact constituting the bit line structure.

3. The method for fabricating the semiconductor structure according to claim 2, wherein after the providing the substrate having the plurality of active structures, and before the forming the plurality of conductive support strips spaced along the first direction, the method further comprises:
    removing a portion of a given one of the plurality of active structures exposed in the bit line contact region to form a second filling region exposing the bit line contact region, the second filling region further exposing a portion of a side surface of a remaining portion of the given active structure.

4. The method for fabricating the semiconductor structure according to claim 1, wherein a material of the given conductive support strip is doped polysilicon.

5. A method for fabricating a semiconductor structure, comprising:
- providing a substrate having a plurality of active structures, each of the plurality of active structures having a bit line contact region;
- forming a plurality of conductive support strips spaced along a first direction, each of the plurality of conductive support strips extending along a second direction, each of the plurality of conductive support strips being connected to the plurality of bit line contact regions, the plurality of bit line contact regions being arranged along the second direction, the first direction and the second direction intersecting with each other;
- forming an initial isolation structure covering a side surface and a top surface of each of the plurality of conductive support strips;
- removing the initial isolation structure positioned on the top surface of a given one of the plurality of conductive support strips;
- removing the given conductive support strip by at least portion of thickness to form a first filling region; wherein a retained portion of the initial isolation structure forms an isolation structure; and
- forming a bit line structure in the first filling region;
- wherein the removing the given conductive support strip by the at least portion of thickness comprises:
- removing all of the given conductive support strip to form the first filling region, the first filling region exposing the bit line contact region of a given one of the plurality of active structures.

6. The method for fabricating the semiconductor structure according to claim 5, wherein the forming the bit line structure in the first filling region comprises:
- forming, in the first filling region, a bit line contact and a bit line arranged in stack, the bit line and the bit line contact constituting the bit line structure.

7. The method for fabricating the semiconductor structure according to claim 6, wherein after the removing the initial isolation structure positioned on the top surface of the given conductive support strip, and before the forming the bit line structure in the first filling region, the method further comprises:
- removing a portion of the given active structure to form a second filling region communicating with the first filling region, the second filling region exposing a portion of a side surface of a remaining portion of the given active structure.

8. The method for fabricating the semiconductor structure according to claim 7, wherein a material of the given conductive support strip is undoped polysilicon, and a material of the bit line contact is doped polysilicon.

9. The method for fabricating the semiconductor structure according to claim 7, comprising:
- forming the bit line contact in the second filling region and a portion of the first filling region, an extension portion is provided at an end of the bit line contact close to the substrate, the extension portion filling up the second filling region to cover the side surface of the given active structure exposed in the second filling region.

10. The method for fabricating the semiconductor structure according to claim 1, wherein after the removing the given conductive support strip by the at least portion of thickness, the method further comprises:
- removing, along the first direction, a portion of a side wall of the initial isolation structure exposed by the first filling region to enlarge a width of the first filling region in the first direction.

11. The method for fabricating the semiconductor structure according to claim 1, wherein after the providing the substrate having the plurality of active structures, the method further comprises:
- adding a repair material into the bit line contact region, and repairing the given active structure at a preset temperature.

12. The method for fabricating the semiconductor structure according to claim 1, wherein the forming the plurality of conductive support strips spaced along the first direction comprises:
- forming a conductive support layer on the substrate, the conductive support layer covering an upper surface of the substrate and filling up the plurality of bit line contact regions; and
- patterning the conductive support layer to form the plurality of conductive support strips spaced along the first direction, each of the plurality of conductive support strips being spaced from a side wall of each of the plurality of bit line contact regions.

13. The method for fabricating the semiconductor structure according to claim 1, wherein the forming the initial isolation structure covering the side surface and the top surface of each of the plurality of conductive support strips comprises:
- forming an initial isolation spacer covering the side surface and the top surface of each of the plurality of conductive support strips, the initial isolation spacer defining a groove between adjacent two of the plurality of conductive support strips; and
- forming an initial dielectric layer in the groove, the initial dielectric layer filling up the groove, the initial dielectric layer and the initial isolation spacer constituting the initial isolation structure.

14. A semiconductor structure, the semiconductor structure being fabricated by means of the method for fabricating the semiconductor structure according to claim 1, the semiconductor structure comprising:
- a substrate having a plurality of active structures, each of the plurality of active structures having a bit line contact region;
- a plurality of bit line structures spaced along a first direction, each of the plurality of bit line structures extending along a second direction, and each of the plurality of bit line structures being connected to the bit line contact regions positioned in a same column in the second direction; and
- an isolation structure covering a side surface of each one of the plurality of bit line structures;
- wherein each one of the plurality of bit line structures comprises a bit line contact and a bit line arranged on the bit line contact, an extension portion is provided at an end of the bit line contact close to the substrate, the extension portion wrapping a portion of a side surface of each one of the plurality of active structures, the bit line comprising a bit line barrier layer, a bit line conductive layer, and a bit line insulating layer sequentially arranged in stack, and the bit line barrier layer being arranged on the bit line contact.

\* \* \* \* \*